United States Patent
Hwang et al.

(10) Patent No.: US 6,748,991 B2
(45) Date of Patent: Jun. 15, 2004

(54) FEEDER FOR SURFACE MOUNTING DEVICE

(75) Inventors: Ji Hyun Hwang, Kyungki-do (KR); Do Hyun Kim, Kyoungki-do (KR); Sang Yeon Hwang, Kyoungki-do (KR)

(73) Assignee: Mirae Corporation, Choongchungnam-do (KR)

( * ) Notice: Subject to any disclaimer, the term of this patent is extended or adjusted under 35 U.S.C. 154(b) by 176 days.

(21) Appl. No.: 09/989,461

(22) Filed: Nov. 21, 2001

(65) Prior Publication Data

US 2002/0062927 A1 May 30, 2002

(30) Foreign Application Priority Data

Nov. 24, 2000 (KR) .......................... 2000-70449
Nov. 24, 2000 (KR) .......................... 2000-70450

(51) Int. Cl.$^7$ ................................ B65C 9/40
(52) U.S. Cl. .................. 156/361; 156/363; 156/362; 156/584; 221/10; 221/13; 221/25; 221/71; 221/72; 221/73; 226/27; 226/33
(58) Field of Search ................ 156/361, 362, 156/363, 344, 584, 540, 541, 542, 367, 368, 378, 379; 221/25, 73, 72, 71, 10, 13; 226/5, 27, 33, 6

(56) References Cited

U.S. PATENT DOCUMENTS

| 4,599,026 A | 7/1986 | Feiber et al. |
| 4,763,811 A | 8/1988 | Mae et al. |
| 5,419,802 A | 5/1995 | Nakatsuka et al. .......... 156/584 |
| 5,517,748 A | 5/1996 | Park |
| 5,713,125 A | 2/1998 | Watanabe et al. |
| 6,126,007 A | * 10/2000 | Kari et al. .................. 206/438 |
| 6,162,007 A | * 12/2000 | Witte .................... 414/416.01 |
| 6,549,619 B1 | 4/2003 | Bell et al. |
| 2002/0062927 A1 | 5/2002 | Hwang et al. |
| 2002/0063137 A1 | 5/2002 | Hwang et al. |

* cited by examiner

Primary Examiner—Richard Crispino
Assistant Examiner—George R. Koch
(74) Attorney, Agent, or Firm—Fleshner & Kim, LLP

(57) ABSTRACT

A feeder for the surface mounting device is disclosed. The feeder includes a feeding unit being installed at one side of a main frame, having a plurality of armature coils and a circular permanent magnetic unit facing the plurality of armature coils to generate a rotation/reverse rotation force and carry a tape at a pitch interval and having a position sensing unit and a position detecting disk capable of sensing the position of the circular permanent magnetic unit, a vinyl separation unit carrying the vinyl removed from the tape by the rotation force or re-carrying the vinyl by the reverse rotation force, and a vinyl recovery unit recovering the vinyl by winding the same by the rotation force or discharging the vinyl by the reverse rotation force.

13 Claims, 12 Drawing Sheets

FEEDER FOR SURFACE MOUNTING DEVICE

BACKGROUND OF THE INVENTION

1. Field of the Invention

The present invention relates to a feeder for a surface mounting device, and more particularly, to a feeder for a surface mounting device which carries surface mounting parts to a parts suction position of a nozzle from the surface mounting device for sucking surface mounting parts and mounting them on a printed circuit board.

2. Description of the Related Art

A surface mounting device includes an X-Y gantry, a module head, a PCB carrier, and a feeder. The module head is assembled to be moved to the X-Y gantry in the X-Y axis direction and sucks surface mounting parts (Hereinafter, referred to as "parts") onto a printed circuit board carried by the PCB carrier and then mounts them on the printed circuit board. The parts to be mounted on the printed circuit board are carried by the feeder and are mounted on the printed circuit board. The feeder which mounts parts on the printed circuit board will now be described with reference to the accompanying drawings.

Figure 1:
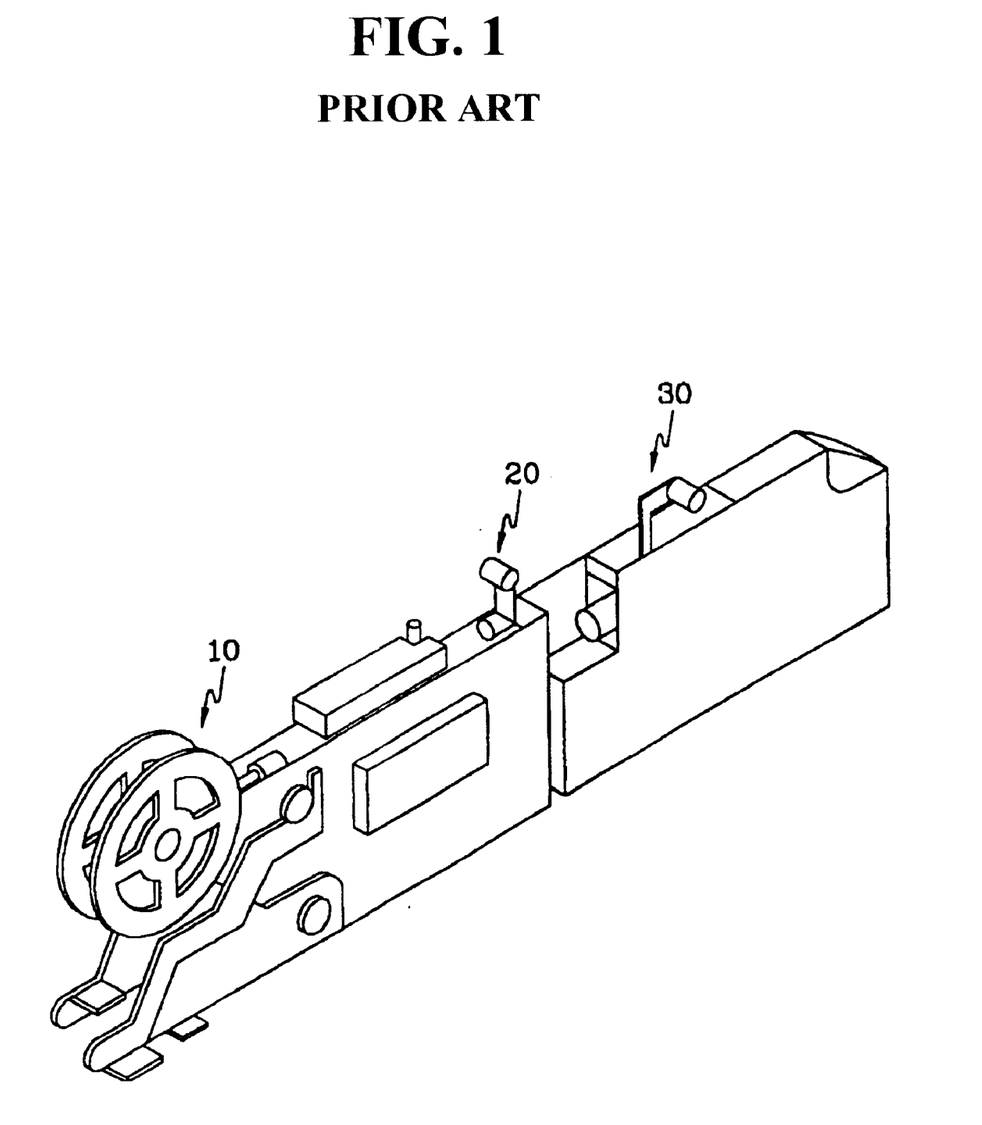
FIG. 1 is a perspective view of a feeder for a surface mounting device according to the conventional art.

As illustrated in FIG. 1, the feeder includes a vinyl recovery unit 10, a vinyl separation unit 20 and a feeding unit 30. A recovery reel 11 is mounted at the vinyl recovery unit 10 and then winds vinyl (V: shown in FIG. 3) carried by the vinyl separation unit 20 to recover the same. The vinyl (V) is separated from a tape (TF: shown in FIG. 3) wound around a tape take-up unit 50 (shown in FIG. 2), and the tape take-up unit 50 is installed at the rear end of the vinyl recovery unit 10. The tape (TF) fed to the feeder 30 is moved by the feeder at a predetermined pitch for each movement and is carried to a work position. Then, it is sucked by a nozzle (N: shown in FIG. 2), is moved to a printed circuit board (not shown) and is mounted thereon.

Figure 2:
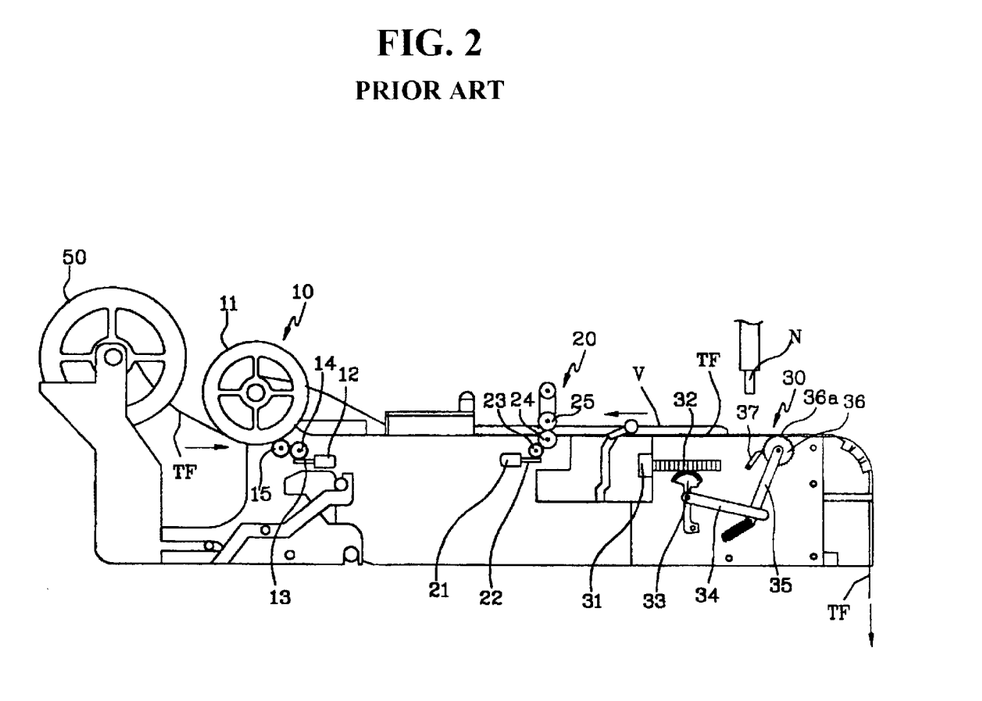
FIG. 2 is a front view of the feeder as shown in FIG. 1.

The feeder which carries the tape (TF) to carry parts to a sucking position of the nozzle (N) includes a vinyl recovery unit 10, a vinyl separation unit 20, a feeding unit 30 and a tape take-up unit 50. The construction of each element will now be described with reference to FIG. 2. As illustrated in FIG. 2, the vinyl recovery unit 10 includes a recovery reel 11, a recovery rotation motor 12, a recovery unit worm 13, a recovery unit worm gear 14 and a recovery unit gear 15. The vinyl separation unit 20 includes a separation rotation motor 21, a separation unit worm 22, a separation unit worm gear 23, a first separation unit gear 24, a second separation unit gear 25, and a third separation unit gear 26. The feeder 30 includes a feed rotation motor 31, a feed worm 32, a sector gear 33, a first arm 34, a second arm 35, and a driving wheel 36 with driving teeth 36a.

At the vinyl recovery unit 10, the recovery rotation motor 12 generating a rotation force for rotating the recovery reel 11 is fixedly installed. At the central axis of rotation of the recovery rotation motor 12, the recovery unit worm 13 is installed. The recovery unit worm 13 is interlockingly rotated by the rotation of the recovery rotation motor 12, and the recovery unit worm gear 14 is rotated by the rotation of the recovery unit worm 13. The recovery unit worm 13 and the recovery unit worm gear 14 change a rotational direction generated from the recovery rotation motor 14 and transfers the same to the recovery unit gear 15. The recovery unit gear 15 having received a rotation force winds the vinyl (V) shown in FIG. 3 to recover the same by rotating the recovery reel 11 in a predetermined direction.

The vinyl (V) wound round the recovery reel 11 of the vinyl recovery unit 10 is carried to the vinyl separation unit 20. With respect to the vinyl separation unit 20, the rotation force generated from the vinyl rotation motor 21 is transferred to the separation unit worm 22 assembled at the central axis of rotation. The rotation force transferred to the separation unit worm 22 is transferred to the separation unit worm gear 23 assembled at the separation unit worm 22. In this process, the rotational direction is changed to be transferred to the first separation unit gear 24. The first separation unit gear 24 is assembled with the second separation unit gear 25 and the third separation unit gear 26 sequentially, and the second separation unit gear 25 and the third separation unit gear 26 are rotated in the reverse direction with each other by the rotation of the first separation unit gear 24.

Figure 3:
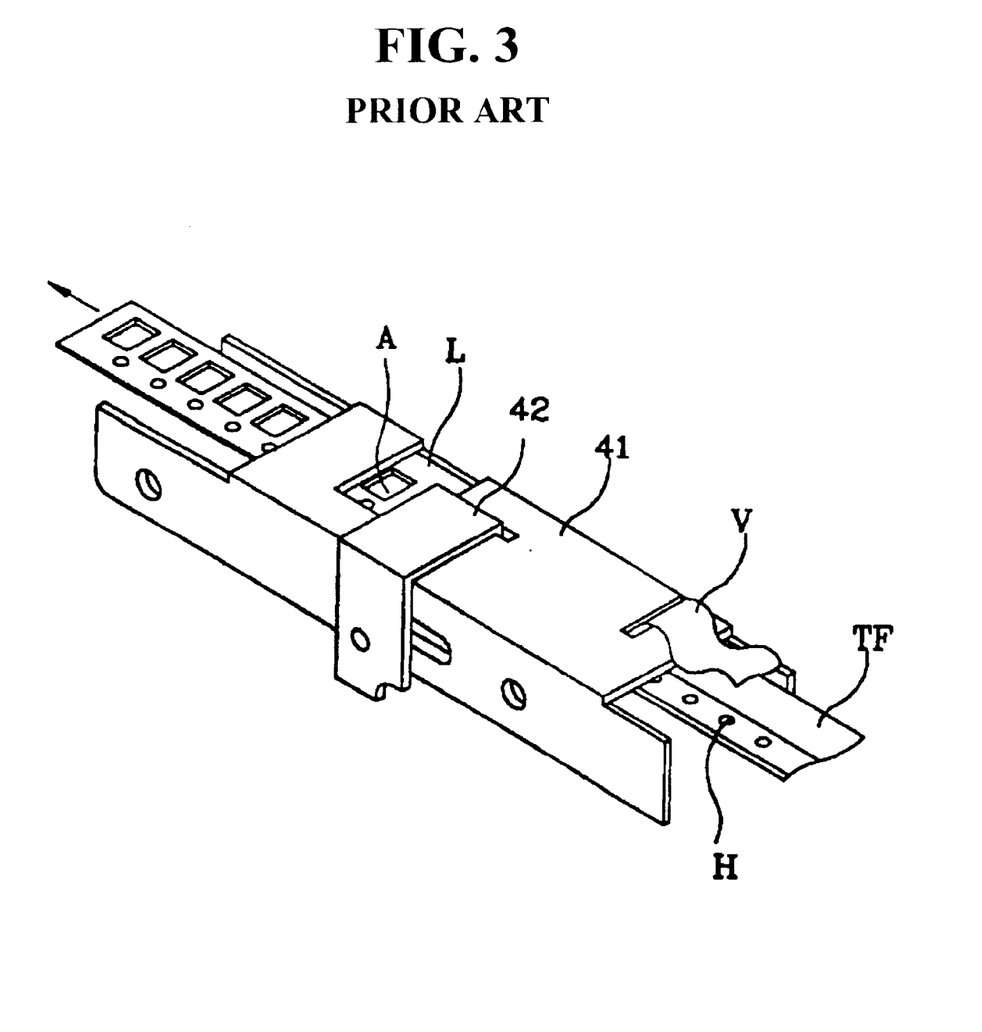
FIG. 3 is a perspective view of a shutter as shown in FIG. 1.

While the second separation unit gear 25 and the third separation unit gear 26 are rotated in the reverse direction, as shown in FIG. 3, the vinyl (V) attached to the tape (TF) is inserted between the second separation unit gear 25 and the third separation unit gear 26 and then the inserted vinyl (V) is carried to the vinyl recovery unit 10. Here, the tape (TF) is moved to the bottom of a cover 41 as shown in FIG. 3 by the rotation of the tape take-up unit 50 in a state where it is wound around the tape take-up unit 50. The tape (TF) moved to the cover 41 is carried to a suction position (A) in a state where the vinyl (V) attached to the tape (TF) is removed. The tape (TF) has a plurality of parts mounting grooves (L) formed at a constant interval, and parts are mounted inside each of the parts mounting grooves (L). When the parts mounting groove (L) with a parts mounted thereto is carried to the suction position (A) of the nozzle (N), a shutter 42 assembled at a cover 41 is opened so that the nozzle (N) can suck the parts. In this state, the nozzle (N) sucks the parts and carries it to the printed circuit board.

To carry the tape (TF) at a predetermined interval, a plurality of transfer holes (A) are formed at one end of the tape (TF) at a predetermined interval. To insert the tape (TF) into the transfer holes (H) formed at a predetermined interval and carry the same at a constant pitch interval, the feeding unit 30 is installed at the bottom of the tape (TF). In the feeding unit 30, a rotation force is generated from the feed rotation motor 31 in order to carry the tap (TF) at a constant pitch interval. The rotation force generated from the feed rotation motor 31 is transferred to the feed worm 32 assembled at the central axis of rotation of the feed rotation motor 31, and thusly the sector gear 33 assembled at the bottom of the feed worm 32 is driven.

When the sector gear 33 is driven, the first arm 34 and second arm 35 assembled at the sector gear 33 are driven to rotate the driving wheel 36 assembled at the second arm 35 at a constant pitch. On the outer circumferential surface of the driving wheel 36 rotated at a constant pitch, the driving teeth 36a are formed at a constant interval. The driving teeth 36a are inserted into the transfer holes (H) formed at the tape (TF) and carries the tape (TF) at a constant pitch to move the parts to the suction position (A) by the rotation of the driving wheel 36. Here, a reverse rotation preventing member 37 assembled at the driving wheel 36 prevents the reverse rotation of the driving wheel 36.

In the above-described feeder of the conventional art, since a great number of elements including a rotation motor, worm gear and linking gear are used for driving the vinyl recovery unit, vinyl separation unit and feeding unit respectively, the structure is made complex and a number of steps of assembling is increased. In addition, the driving wheel carrying the tape at a constant pitch is provided with the reverse rotation preventing member, thus disabling the adjustment of the position of the tape if a parts is deviated from a designated position.

SUMMARY OF THE INVENTION

It is, therefore, an object of the present invention to provide a feeder for a surface mounting device in which the constitution of the feeder is simplified by forming integrally a parts feeding unit carrying the tape wrapped up parts at a constant pitch, thus enabling a forward/backward rotation and adjusting the feed position of the tape.

It is another object of the present invention to provide a feeder for a surface mounting device in which a parts feeding unit is formed integrally, thus performing an assembling process easily, and a forward/backward rotation of the tape is possible, thus adjusting the feed position of the tape.

To achieve the above objects, there is provided a feeder for the surface mounting device comprising: a feeding unit being installed at one side of a main frame, having a plurality of armature coils and a circular permanent magnetic unit facing the plurality of armature coils to generate a rotation/reverse rotation force and carry a tape at a predetermined pitch interval and having a position sensing unit and a position detecting disk capable of sensing the position of the circular permanent magnetic unit; a vinyl separation unit being assembled at the main frame and carrying the vinyl removed from the tape by the rotation force generated from the feeding unit or re-carrying the vinyl by the reverse rotation force; and a vinyl recovery unit being assembled at the other end of the main frame, being connected to the vinyl separation unit by a belt, and recovering the vinyl by winding the same by the rotation force transferred from the vinyl separation unit through the belt 133 or discharging the vinyl to the vinyl separation unit by the reverse rotation force.

In addition, there is provided a feeder for the surface mounting device comprising: a feeding unit including a first disc member installed a plurality of armature coils and a rotation shaft rotatably installed at its center; a second disc member inserted and installed to the rotation shaft to be linked and rotated by the rotation of the rotation shaft; a circular permanent magnetic unit mounted to the second disc member and for generating a rotation/reverse rotation force by the interaction with the armature coils mounted to an upper portion of the first disc member; a second feeding unit gear installed at a predetermined distance on the second disc member to transfer the rotation force of the rotation shaft; a first feeding unit gear installed at a predetermined distance on the second feeding unit gear to transfer the rotation force of the rotation shaft; a driving gear connected to the first feeding unit gear by a first gear and having driving teeth formed on its outer circumferential surface to carry a tape to a suction position with a constant pitch by receiving the rotation/reverse rotation force transferred from the first gear; a position detecting unit gear connected to the second feeding unit gear by a second gear and for rotating the rotation shaft by receiving the rotation/reverse rotation force generated from the second feeding unit gear; a position detecting unit installed to the other end of the rotation shaft to sense the rotation speed of the rotation shaft; a vinyl separation unit being assembled at the main frame and carrying the vinyl removed from the tape by the rotation force generated from the feeding unit or re-carrying the vinyl by the reverse rotation force; and a vinyl recovery unit being assembled at the other end of the main frame, being connected to the vinyl separation unit by a belt, and recovering the vinyl by winding the same by the rotation force transferred from the vinyl separation unit through the belt 133 or discharging the vinyl to the vinyl separation unit by the reverse rotation force.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A first embodiment of the present invention will now be described with reference to the accompanying drawings.

Figure 4:
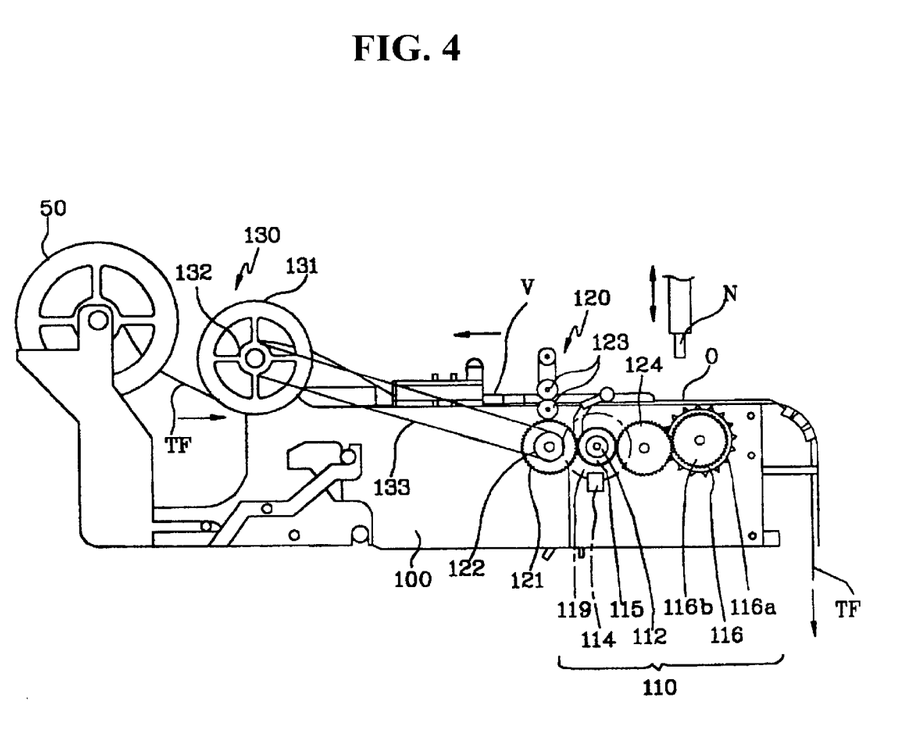
FIG. 4 is a front view of a feeder for a surface mounting device according to a first embodiment of the present invention.
Figure 5:
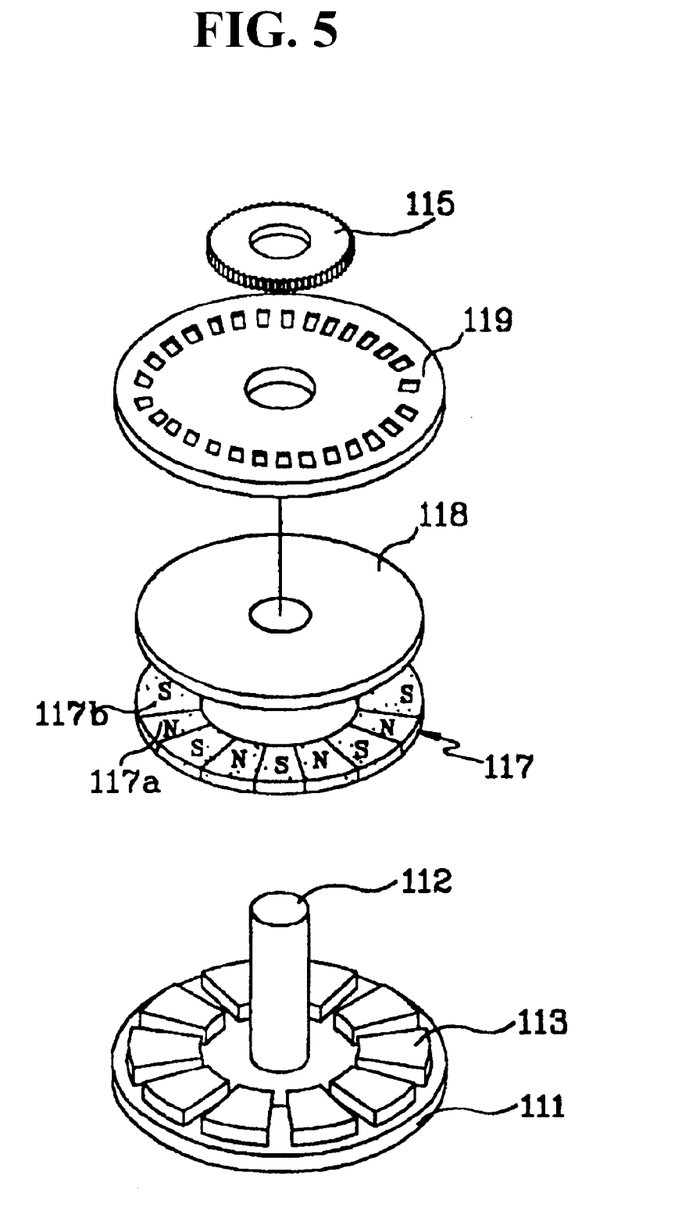
FIG. 5 is a perspective view of a driving unit as shown in FIG. 4.
Figure 6:
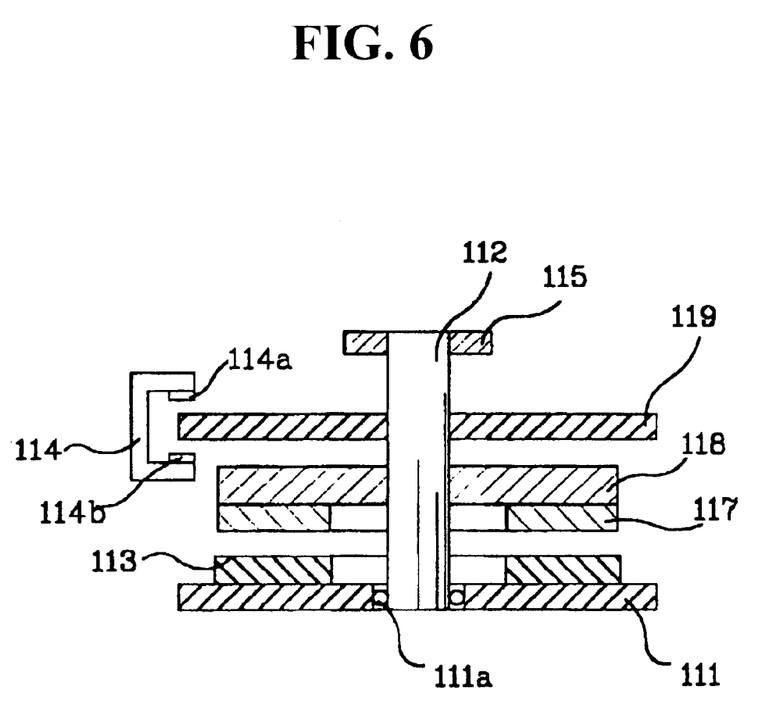
FIG. 6 is a side cross-sectional view of the driving unit as shown in FIG. 5.

FIG. 4 is a front view of a feeder for a surface mounting device according to the present invention. FIG. 5 is a perspective view of a driving unit as shown in FIG. 4. FIG. 6 is a side cross-sectional view of the driving unit as shown in FIG. 5.

As shown in FIGS. 4 through 6, the feeder for the surface mounting device includes: a feeding unit 110 being installed at one side of a main frame 100, having a plurality of armature coils 113 and a circular permanent magnetic unit 117 facing the plurality of armature coils 113 to generate a rotation/reverse rotation force by the interaction between the armature coils 113 and the circular permanent magnetic unit 117 and carry a tape (TF) at a predetermined pitch interval by the rotation/reverse rotation force generated from the circular permanent magnetic unit 117, and having a position sensing unit 114 for sensing the position of the circular permanent magnetic unit 117 installed at one end of the circular permanent magnetic unit 117; a vinyl separation unit 120 being assembled at the main frame 100, being connected to the feeder 110, and carrying the vinyl (V) removed from the tape (TF) by the rotation force generated from the feeding unit 110 or re-carrying the vinyl (V) by the reverse rotation force; and a vinyl recovery unit 130 being assembled at the other end of the main frame 130, being connected to the vinyl separation unit 120 by a belt 133, and recovering the vinyl (V) by winding the same by the rotation force transferred from the vinyl separation unit 120 through the belt 133 or discharging the vinyl (V) to the vinyl separation unit 120 by the reverse rotation force.

The constitution and operation of the feeder for the surface mounting device according to the first embodiment of the present invention will now be described in more detail.

According to the first embodiment of the present invention, the feeder for the surface mounting device includes a feeding unit 110, a vinyl separation unit 120, and a vinyl recovery unit 130. As illustrated in FIG. 4, the feeding unit 110 is installed at one side of the main frame 100, and the vinyl recovery unit 130 is installed at the other side of the main frame 100. The vinyl separation unit 120 is assembled between the feeding unit 110 assembled at one side of the main frame 100 and the vinyl separation unit 130 assembled at the other side thereof. The tape (TF) with which a parts is packaged is stored in a reel shape in a state where it is recovered by the vinyl recovery unit 130.

The tape (TF) is fed to the feeding unit 110 from a tape take-up unit 50 installed at the rear end of the vinyl recovery unit 130 along the upper side of the main frame 100. When the vinyl (V) is separated from the tape (TF) fed to the feeding unit 110 and a parts is carried to an suction position (O), a nozzle (N) is moved in a vertical direction to suck the parts and carry it to a printed circuit board (not shown). The tape (TF) from which the vinyl (V) is removed is discharged to the bottom of one end of the main frame 100. So that the nozzle (N) can suck the parts, the vinyl (V) separated from the tape (TF) is hung onto the vinyl separation unit 120, is carried at a constant pitch interval of the tape (TF), and then is discharged to the outside. Here, when carrying the tape (TF), if the parts is not accurately carried, the tape (TF) is reversely carried, so that the nozzle (N) can suck the parts.

To reversely carry the tape (TF) by making the rotation/reverse rotation of the feeding unit 110 possible, the feeding unit 110 has a plurality of armature coils 113 in a circle and a circular permanent magnetic unit 117 facing the plurality of armature coils 113, for thereby generating a rotation/reverse rotation force by the interaction between the armature coils 113 and the circular permanent magnetic unit 117. The circular permanent magnetic unit 117 is formed of a plurality of N polar permanent magnets 117a and S polar magnets 117b arranged in turns.

To sense the rotation/reverse rotation force generated from the armature coils 113 and the circular permanent magnetic unit 117, a position sensing unit 114 is provided at the feeding unit 110. The position sensing unit 114 is installed at a predetermined distance from the armature coils 113 and the circular permanent magnetic unit 117 so that it can be connected to the armature coils 113 and the circular permanent magnetic unit 117 by a gear 124. The rotation speed sensed by the position sensing unit 114 is used for precisely controlling the carrying of the tape (TF) with which a parts (not shown) is packaged to the suction position (O) of the nozzle (N) by a controller (not shown). At a predetermined portion of the position sensing unit 114, as illustrated in FIG. 6, a light receiving element 114a and a light emitting element 114b are installed.

The feeding unit 110 and the vinyl separation unit 120 are connected so that they are synchronized and rotated by the rotation of the feeding unit 110 upon receipt of the rotation/reverse rotation force generated from the feeding unit 110 carrying the tape (TF) to the suction position (O) of the nozzle (N). The vinyl separation unit 120 is rotated to discharge the vinyl (V) taken off from the tape (TF) to the outside by the rotation force generated from the feeding unit 110 or to re-carry the vinyl (V) to the feeding unit 110 by the reverse rotation force. That is, when the feeding unit 110 carries the tape to the suction position (O) of the nozzle (N) by rotation, the vinyl separation unit 120 is rotated to discharge the vinyl separated from the tape (TF) to the outside.

In a case that the feeding unit 110 reversely carries the tape (TF) by reverse rotation, the vinyl separation unit 120 is synchronized with the reverse rotation of the feeding unit 110 and reversely rotated to re-carry the vinyl (V) to the feeding unit 110. The vinyl recovery unit 130 synchronized by the rotation/reverse rotation of the feeding unit 110 and the vinyl separation unit 120 to discharge and carry the tape (TF) is connected to the vinyl separation unit 120 by the belt 133, for thereby recovering the vinyl (V) by winding the same by the rotation force transferred from the vinyl separation unit 120 or discharging the vinyl (V) to the vinyl separation unit 120 by the reverse rotation force.

The constitution of the feeding unit 110, vinyl separation unit 120 and vinyl separation unit 130 capable of rotation/reverse rotation will now be described in more detail. Firstly, the feeding unit 110 includes a first disc member 111, a position sensing unit 114, a feeding unit gear 115, a driving gear 116, a circular permanent magnetic unit 117, a second disc member 118, and a position detecting disc 119.

The first disc member 111 is fixedly assembled at one side of the main frame 100 and has a plurality of armature coils 113 assembled on the plane at a predetermined interval and a rotating shaft 112 rotatably installed at the center. Here, the first disc member 111 is provided with a ball bearing 111a so that the rotating shaft 112 can be smoothly rotated. At one end of the rotating shaft 112 assembled at the central axis of the first disc member 111, the second disc member 118 is fixedly installed.

The second disc member 118 fixedly assembled at one end of the rotating shaft 112 is interlockingly rotated by the rotation of the rotating shaft 112. At the bottom of the second disc member 118, the circular permanent magnetic unit 117 is connected. The circular permanent magnetic unit 117 assembled at the second disc member 118 generates a rotation/reverse rotation force by the interaction with the armature coils 113 assembled on the surface of the first disc member 111. By the rotation/reverse rotation force generated between the permanent magnetic unit 117 and the armature coils 113, the rotating shaft 112 is rotated/reversely rotated.

At one end of the rotating shaft 112 rotated/reversely rotated, the position detecting disc 119 is installed. The position detecting disc 119 has a plurality of slots forming a circle, has a position sensing unit 114 inserted into the rotating shaft 112 to be assembled at one end thereof, and is connected to the feeding unit gear 116 at the upper side. The feeding unit gear 115 and the driving gear 116 are connected by a gear 124 at a predetermined distance from each other. Here, the position sensing unit 114 senses the rotating position of the position detecting disc 119 to transfer it to a controller (not shown). The controller is used for controlling the carrying operation of the tape (TF) more precisely by receiving the transferred rotating position.

On the outer circumferential surface of the driving gear 116, driving teeth 116a to be inserted into the transfer holes (H: shown in FIG. 3) are formed. The driving teeth 116a formed on the outer circumferential surface of the driving gear 116 at a constant interval are moved at a constant pitch interval at the rotation/reverse rotation of the driving gear 116 to carry the tape (TF) to the suction position (O) of the nozzle (N) or reversely carry the tape (TF) carried to the suction position (O), for thereby precisely carrying a parts to the suction position (O).

The feeding unit 110 carrying the tape (TF) to the suction position (O) by the driving gear 116 or generating a driving fore for rotating the driving gear 116 is directly connected to the vinyl separation unit 120. That is, the position detecting disc 119 of the feeding unit 110 and a first separation unit gear 121 of the vinyl separation unit 120 are connected and thus the rotation/reverse rotation force transferred from the position detecting disc 119 is transferred to the first separation unit gear 121.

The vinyl separation unit 120 receiving the rotation/reverse rotation force through the first separation unit gear 121 includes a first separation unit gear 121, a second separation unit gear 122, and a vinyl discharge gear 123. The first separation unit 121 transfers the rotation/reverse rotation force transferred from the position detecting disc 119 to the second separation unit gear 122. The second separation unit gear 122 having received the rotation/reverse rotation force is connected to one end of the first separation unit gear 121 to thus transfer the rotation/reverse rotation force transferred from the first separation unit gear 121 to the vinyl discharge gear 123.

The vinyl discharge gear 123 includes a plurality of gears and is rotated in the reverse direction to carry the vinyl (V) to the vinyl recovery unit 130 when it receives the rotation force transferred from the second separation unit gear 122, or to re-carry the vinyl (V) to the feeding unit 110 when it receives the reverse rotation force. The vinyl recovery unit 130 is connected to the first separation unit gear 121 of the vinyl separation unit 120 carrying and re-carrying the vinyl (V) by the belt 133.

The vinyl recovery unit 130 includes a recovery unit gear 131 and a recovery reel 132. The recovery unit gear 131 is connected to the first separation unit gear 121 by the belt 133 to receive the rotation/reverse rotation force of the first separation unit gear 121. The recovery unit gear 131 having received the rotation/reverse rotation force is synchronized with the recovery reel 132 when the feeding unit 110 adjusts the feed position of the tape (TF) by rotating/reversely rotating the recovery reel 132 assembled at one side according to the rotation/reverse rotation force, for thereby recovering the vinyl (V) by winding it around the recovery reel 312 or discharging the recovered vinyl (V) to the vinyl separation unit 120.

Figure 7:
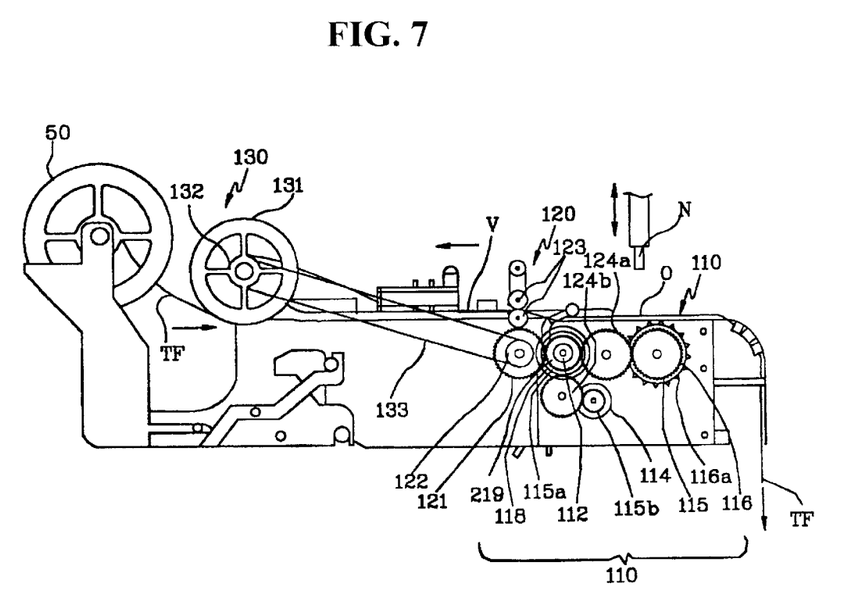
FIG. 7 is a front view of a feeder for a surface mounting device according to a second embodiment of the present invention
Figure 8:
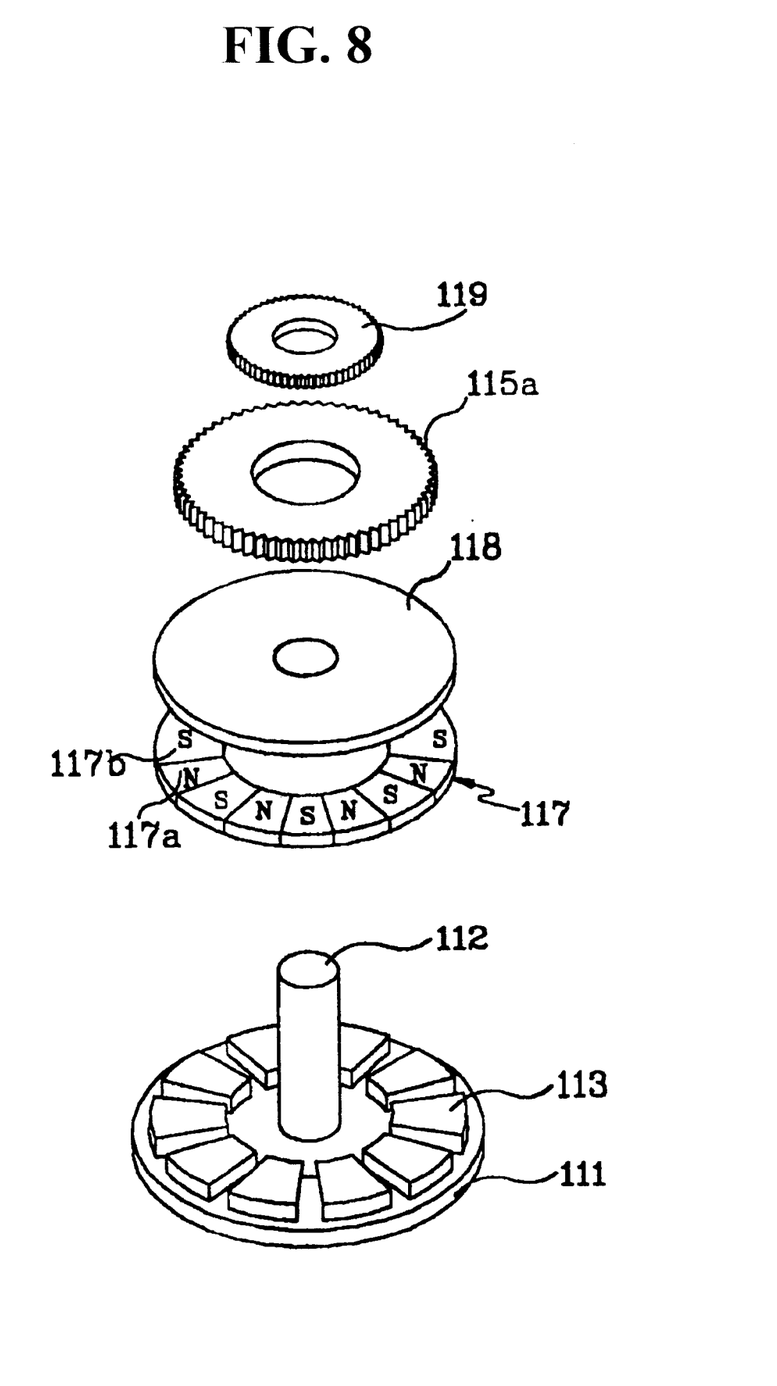
FIG. 8 is a perspective view of a driving gear as shown in FIG. 7.
Figure 9:
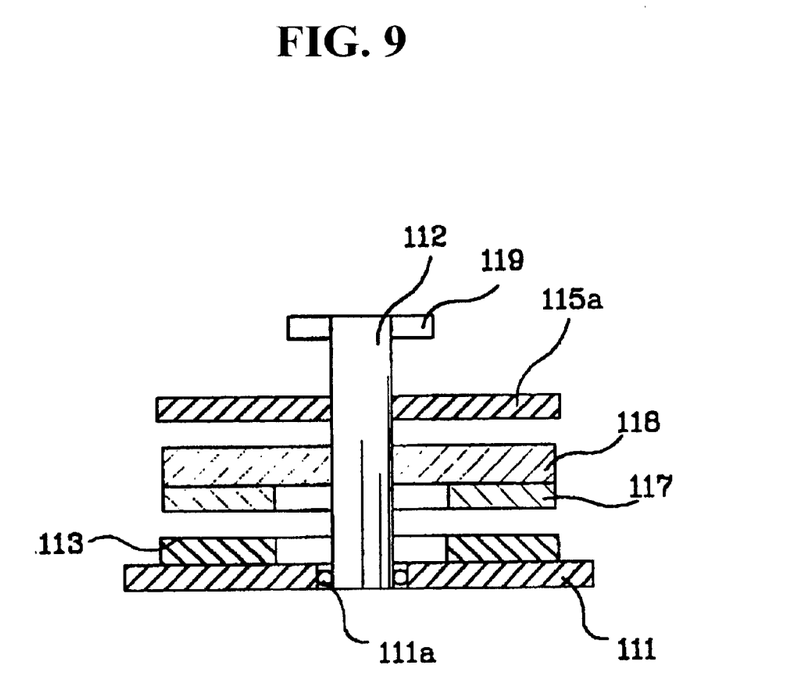
FIG. 9 is a side cross-sectional view of the driving gear as shown in FIG. 8.
Figure 10:
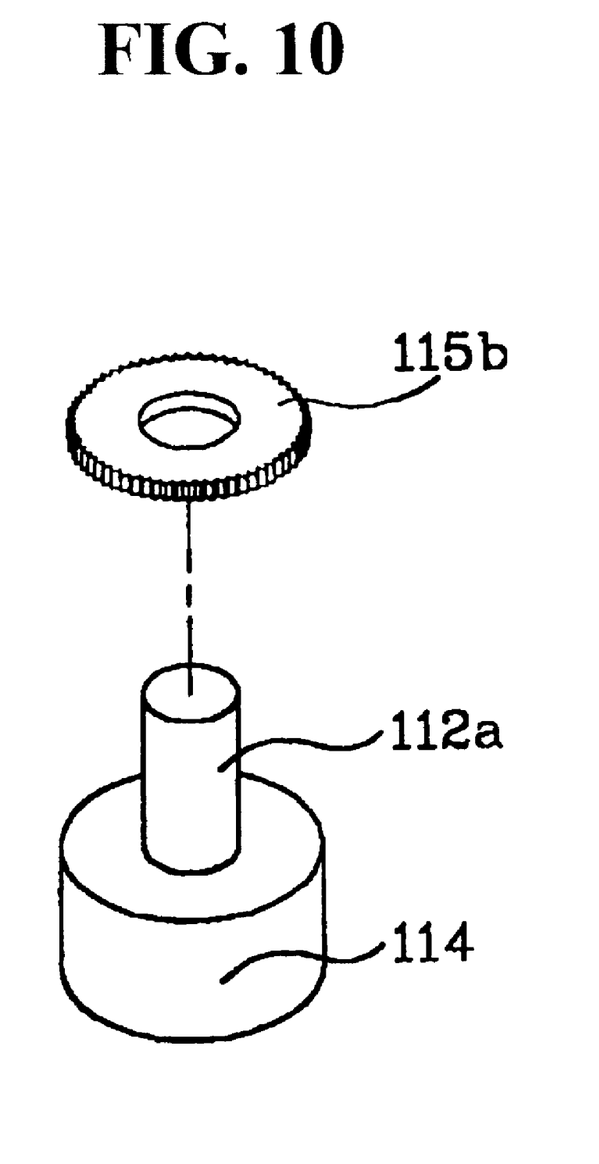
FIG. 10 is a perspective view of a driving gear and a feeding unit gear as shown in FIG. 7.
Figure 11:
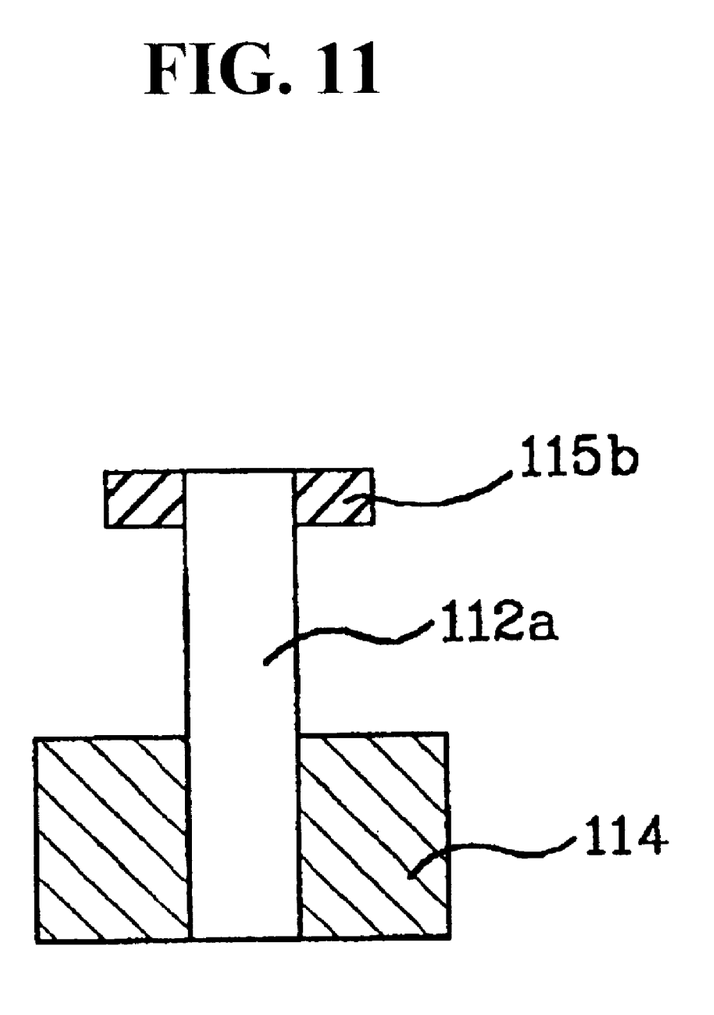
FIG. 11 is a side cross-sectional of the driving gear and the feeding unit gear as shown in FIG. 10.
Figure 12:
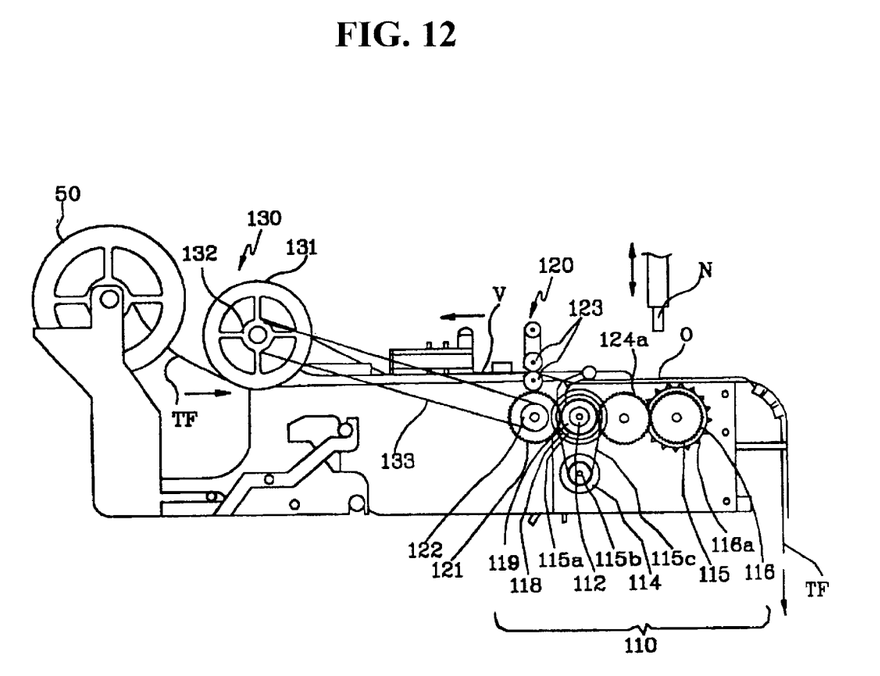
FIG. 12 is a side cross-sectional view illustrating the feeder for the surface mounting device according the second embodiment of the present invention.

Meanwhile, FIG. 7 is a front view of a feeder for a surface mounting device according to a second embodiment of the present invention; FIG. 8 is a perspective view of a driving gear as shown in FIG. 7; FIG. 9 is a side cross-sectional view of the driving gear as shown in FIG. 8; FIG. 10 is a perspective view of a driving gear and a feeding unit gear as shown in FIG. 7; FIG. 11 is a side cross-sectional of the driving gear and the feeding unit gear as shown in FIG. 10; and FIG. 12 is a side cross-sectional view illustrating the feeder for the surface mounting device according the second embodiment of the present invention.

In the drawings, the same elements as in the first embodiment has the same reference numerals, so a detailed description thereof will be omitted.

As shown in FIGS. 7 through 11, the feeder for the surface mounting device includes: a feeding unit 110 being installed at one side of a main frame 100, having a plurality of armature coils 113, generating a rotation/reverse rotation force by rotating a circular permanent magnetic unit 117 by the interaction between the armature coils 113 and the circular permanent magnetic unit 117, carrying a tape (TF) at a predetermined pitch interval by receiving the rotation force generated from the plurality of armature coils 113 and the circular permanent magnetic unit 117 through a first gear 124a at a predetermined distance from the plurality of armature coils 113 and the circular permanent magnetic unit 117, and sensing a rotating position of the circular permanent magnetic unit 117 by receiving the rotation force through a second gear 124b at a predetermined distance from the lower side of the plurality of armature coils 113 and circular permanent magnetic unit 117; a vinyl separation unit 120 being assembled at the main frame 100, being connected to the feeder 110, and carrying the vinyl (V) removed from the tape (TF) by the rotation force generated from the feeding unit 110 or re-carrying the vinyl (V) by the reverse rotation force; and a vinyl recovery unit 130 being assembled at the other end of the main frame 130, being connected to the vinyl separation unit 120 by a belt 133, and recovering the vinyl (V) by winding the same by the rotation force transferred from the vinyl separation unit 120 through the belt 133 or discharging the vinyl (V) to the vinyl separation unit 120 by the reverse rotation force.

Since the construction and operation of the second embodiment of the present invention are similar to the first embodiment of the present invention, so repetitive explanations to the same parts will be omitted.

According to the second embodiment of the present invention, the feeder for the surface mounting device includes a feeding unit 110, a vinyl separation unit 120, and a vinyl recovery unit 130. The construction of each element is similar to those in the first embodiment, so it will be described from the viewpoint of the differences.

Firstly, the feeding unit 110 generating a rotation/reverse rotation force includes a first disc member 111, a position detecting unit 114, a second feeding unit gear 115a, a position sensing unit gear 115b, a driving gear 116, a circular permanent magnetic unit 117, a second disc member 118, and a first feeding unit gear 219.

The construction and operation of first and second disc members 111 and 118 are the same as those of the first embodiment, so they will be omitted.

In addition, as the position detecting unit 114, an encoder is used.

At one end of the upper part of a rotating shaft 112 which is rotate or reversely rotate, the first feeding unit gear 219 is installed as shown in FIGS. 8 and 9. The first feeding unit gear 219 is inserted into the rotating shaft 112 and is installed at a predetermined distance from the second feeding unit gear 115a and the second disc member 118 to thus be interlockingly rotated by the rotation of the rotating shaft 112. The first feeding unit gear 219 is connected to a first gear 124a, and the first gear 124a is connected to the driving gear 116. The driving gear 116 connected to the first gear 124a is rotated by receiving the rotation/reverse rotation force transferred from the first gear 124a.

On the outer circumferential surface of the driving gear 116, driving teeth 116a are formed to carry or re-carry a tape (TF) to a suction position (O). The driving teeth 116a for carrying the tape (TF) at a constant pitch interval are formed on the outer circumferential surface of the driving gear 116 at a constant interval. The driving teeth 116a are inserted into transfer holes (H: shown in FIG. 3) formed at the tape (TF) and are rotated at a constant pitch interval by the rotation of the driving gear 116 for thereby carrying the tape (TF) to the suction position (O) or reversely carrying it.

At the first feeding unit gear 219 connected with the first gear 124a, the second gear 124b is connected. The position sensing unit gear 115b connected with the second feeding unit gear 115a by using the second gear 124b receives the rotation/reverse rotation force of the second driving gear 115a through the second gear 124b. Here, the first feeding unit gear 219 and the position sensing unit gear 115b connected by the second gear 124b can be connected by a belt 115c in place of the second gear 124b as shown in FIG. 12, for thereby making the construction simpler.

The position sensing unit gear 115b receiving the rotation/reverse rotation force fed from the second gear 124b or the belt 115c rotates the central axis 112a of rotation by the rotation/reverse rotation force transferred from the position sensing unit gear 115b. The central axis 112a of rotation is rotatably assembled at the main frame 100 and is non-rotatably connected to the central axis of rotation of the position sensing unit gear 115b to thus be rotated by the rotation of the position sensing unit gear 115b. At the other end of the central axis 112a of rotation rotated by the position sensing unit gear 115b, a position sensing unit 114 for sensing a rotation speed is installed.

The position sensing unit 114 is inserted into the central axis 112a of rotation to sense the rotation speed of the central axis 112a of rotation. The position sensing unit for sensing the rotation speed of the central axis 112a of rotation transmits a sensed rotation speed to a controller (not shown). The controller adjusts the feed operation of the tape (TF) by using a received rotation speed more precisely.

The feeding unit 110 for carrying the tape (TF) to the suction position (O) or sensing the rotation speed is directly connected to the vinyl separation unit 120. That is, the first feeding unit gear 219 of the feeding unit 110 and the first separation unit gear 121 of the vinyl separation unit 120 are connected, and thus the first separation unit gear 121 receives the rotation/reverse rotation force transferred from the first feeding unit gear 219.

The vinyl separation unit 120 receiving the rotation/reverse rotation force through the first separation unit gear 121 includes a first separation unit gear 121, a second separation unit gear 122, and a vinyl discharge gear 123. The first separation unit gear 121 transfers the rotation/reverse rotation force transferred from the first feeding unit gear 219 to the second separation unit gear 122. The second separation unit gear 122 having received the rotation/reverse rotation force is connected to one end of the first separation unit gear 121 to transfer the rotation/reverse rotation force transferred from the first separation unit gear 121 to the vinyl discharge gear 123.

The construction and operation of the vinyl discharge gear 123 and the vinyl recovery unit 130 are the same as those according to the first embodiment, so they will be omitted.

As seen from above, the feeder for carrying the tape at a constant pitch is formed integrally, thus improving a feed rate and simplifying the constitution of the feeder. In addition, the feeder, vinyl separation unit and vinyl recovery unit are rotated/reversely rotated by synchronization with one another, thus adjusting the feed position of the tape.

As explained above, the feeder for the surface mounting device of the present invention can improve a feed rate and simplify the constitution of the feeder by forming the feeder for carrying the tape at a constant pitch integrally. In addition, the feeder, vinyl separation unit and vinyl recovery unit are rotated/reversely rotated by synchronization with one another, thus adjusting the feed position of the tape.

What is claimed is:

1. A feeder for the surface mounting device comprising:
   a feeding unit being installed at one side of a main frame, having a plurality of armature coils and a circular permanent magnetic unit facing the plurality of armature coils to generate a rotation/reverse rotation force and carry a tape at a predetermined pitch interval and having a position sensing unit and a position detecting disk capable of sensing the position of the circular permanent magnetic unit;
   a vinyl separation unit being assembled at the main frame and carrying the vinyl removed from the tape by the rotation force generated from the feeding unit or re-carrying the vinyl by the reverse rotation force; and
   a vinyl recovery unit being assembled at the other end of the main frame, being connected to the vinyl separation unit by a belt, and recovering the vinyl by winding the same by the rotation force transferred from the vinyl separation unit through the belt 133 or discharging the vinyl to the vinyl separation unit by the reverse rotation force.

2. The feeder for the surface mounting device according to claim 1, wherein the feeding unit comprises a first disc member installed a plurality of armature coils and a rotation shaft rotatably installed at its center;
   a second disc member inserted and installed to the rotation shaft to be linked and rotated by the rotation of the rotation shaft;
   a circular permanent magnetic unit mounted to a lower portion of the second disc member and for generating a rotation/reverse rotation force by the interaction with the armature coils;
   a position detecting disk installed to an upper portion of the second disc member with a predetermined distance and for transferring rotation force of the rotation shaft;
   a feeding unit gear assembled to an end of the rotation shaft, which is mounted to the main frame, and connected to the position detecting disc by a gear, thereby rotating the rotation shaft by the rotation/reverse rotation force generated from the position detecting disc;
   a driving gear assembled to a bottom surface of the feeding unit gear and inserted to a rotation shaft, thereby rotating a driving teeth inserted to a transfer hole by the rotation of the rotation shaft and carrying the tape with a constant pitch interval; and
   a position detecting unit assembled to the other end of the rotation shaft for sensing the rotation speed of the rotation shaft.

3. The feeder for the surface mounting device according to claim 2, wherein a ball bearing is installed at the center portion of the first disc member in order to be assembled and rotated the rotation shaft.

4. The feeder for the surface mounting device according to claim 2, wherein the position detecting unit comprises a light receiving element and a light emitting element.

5. The feeder for the surface mounting device according to claim 1, wherein the position detecting unit comprises a light receiving element and a light emitting element, which are installed to a predetermined portion thereof.

6. The feeder for the surface mounting device according to claim 1, wherein the vinyl separation unit comprises a first separation unit connected to the feeding unit gear and for receiving the rotation/reverse rotation force transferred from the feeding unit, thereby performing rotation/reverse rotation;
   a second separation unit gear connected to an end of the first separation unit and rotated by the rotation/reverse rotation force of the first separation unit gear; and a vinyl discharge gear connected to the second separation unit gear and rotated in the reverse direction to carry the vinyl when it receives the rotation force transferred from the second separation unit gear, or to re-carry the vinyl when it receives the reverse rotation force of the second separation unit gear.

7. The feeder for the surface mounting device according to claim 1, wherein the vinyl recovery unit comprises a recovery unit gear connected to the first separation unit gear by a belt to receive the rotation/reverse rotation force of the first separation unit gear, thereby performing rotation/reverse rotation; and a recovery reel assembled at one side of the recovery unit gear, for thereby recovering the vinyl by winding it around the recovery reel or discharging the recovered vinyl to the vinyl separation unit according to the rotation/reverse rotation force of the recovery unit gear.

8. A feeder for the surface mounting device comprising:

a feeding unit including a first disc member installed a plurality of armature coils and a rotation shaft rotatably installed at its center; a second disc member inserted and installed to the rotation shaft to be linked and rotated by the rotation of the rotation shaft; a circular permanent magnetic unit mounted to the second disc member and for generating a rotation/reverse rotation force by the interaction with the armature coils mounted to an upper portion of the first disc member; a second feeding unit gear installed at a predetermined distance on the second disc member to transfer the rotation force of the rotation shaft; a first feeding unit gear installed at a predetermined distance on the second feeding unit gear to transfer the rotation force of the rotation shaft; a driving gear connected to the first feeding unit gear by a first gear and having driving teeth formed on its outer circumferential surface to carry a tape to a suction position with a constant pitch by receiving the rotation/reverse rotation force transferred from the first gear; a position detecting unit gear connected to the second feeding unit gear by a second gear and for rotating the rotation shaft by receiving the rotation/reverse rotation force generated from the second feeding unit gear; a position detecting unit installed to the other end of the rotation shaft to sense the rotation speed of the rotation shaft;

a vinyl separation unit being assembled at the main frame and carrying the vinyl removed from the tape by the rotation force generated from the feeding unit or re-carrying the vinyl by the reverse rotation force; and a vinyl recovery unit being assembled at the other end of the main frame, being connected to the vinyl separation unit by a belt, and recovering the vinyl by winding the same by the rotation force transferred from the vinyl separation unit through the belt 133 or discharging the vinyl to the vinyl separation unit by the reverse rotation force.

9. The feeder for the surface mounting device according to claim 8, wherein a ball bearing is installed at the center portion of the first disc member in order to be assembled and rotated the rotation shaft.

10. The feeder for the surface mounting device according to claim 8, wherein the position detecting gear receives the rotation/reverse rotation force from the second feeding unit gear by a belt.

11. The feeder for the surface mounting device according to claim 8, wherein the vinyl separation unit comprises a first separation unit connected to the first feeding unit gear and for receiving the rotation/reverse rotation force transferred from the feeding unit, thereby performing rotation/reverse rotation;

a second separation unit gear connected to an end of the first separation unit and rotated by the rotation/reverse rotation force of the first separation unit gear; and a vinyl discharge gear connected to the second separation unit gear and rotated in the reverse direction to carry the vinyl when it receives the rotation force transferred from the second separation unit gear, or to re-carry the vinyl when it receives the reverse rotation force of the second separation unit gear.

12. The feeder for the surface mounting device according to claim 8, wherein the vinyl recovery unit comprises a recovery unit gear connected to the first separation unit gear by a belt to receive the rotation/reverse rotation force of the first separation unit gear, thereby performing rotation/reverse rotation; and a recovery reel assembled at one side of the recovery unit gear, for thereby recovering the vinyl by winding it around the recovery reel or discharging the recovered vinyl to the vinyl separation unit according to the rotation/reverse rotation force of the recovery unit gear.

13. The feeder for the surface mounting device according to claim 8, wherein an encoder is used as the position detecting unit.

* * * * *